(12) United States Patent
Ellis et al.

(10) Patent No.: US 10,403,786 B2
(45) Date of Patent: Sep. 3, 2019

(54) OPTOELECTRONIC SYSTEM AND METHOD FOR ITS FABRICATION

(71) Applicant: Kabushiki Kaisha Toshiba, Minato-ku (JP)

(72) Inventors: David Julian Peter Ellis, Cambridge (GB); Anthony John Bennett, Cambridge (GB); Andrew James Shields, Cambridge (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/682,695

(22) Filed: Aug. 22, 2017

(65) Prior Publication Data

US 2018/0114877 A1    Apr. 26, 2018

(30) Foreign Application Priority Data

Oct. 24, 2016    (GB) .................................. 1617922.8

(51) Int. Cl.
  *G02B 6/42* (2006.01)
  *H01L 27/15* (2006.01)
  (Continued)

(52) U.S. Cl.
  CPC .............. *H01L 33/06* (2013.01); *G02B 6/42* (2013.01); *G02B 6/4201* (2013.01); *H01L 27/15* (2013.01); *H01L 33/58* (2013.01)

(58) Field of Classification Search
  CPC ......... H01L 33/06; H01L 27/15; H01L 33/58; G02B 6/42; G02B 6/4201
  See application file for complete search history.

(56) References Cited

U.S. PATENT DOCUMENTS

| 4,892,377 A | * | 1/1990 | Randle | ................. G02B 6/4202 385/39 |
| 6,431,766 B1 | * | 8/2002 | Randle | ................... G02B 6/423 385/92 |

(Continued)

FOREIGN PATENT DOCUMENTS

JP    2015-191054 A    11/2015

OTHER PUBLICATIONS

Bhattacharya and Mi, "Quantum-Dot Optoelectronic Devices" Proceedings of the IEEE, vol. 95, No. 9, Sep. 2007, 1723-40.*

(Continued)

*Primary Examiner* — Allen L Parker
*Assistant Examiner* — Charles N Ausar-El
(74) *Attorney, Agent, or Firm* — Oblon, McClelland, Maier & Neustadt, L.L.P.

(57) ABSTRACT

An optoelectronic system comprising a first member and a second member, said first member and said second member comprising a plurality of layers, wherein each member has a profiled mating surface, the first member being connected to the second member such that the growth direction of the layers of the first member are orthogonal to the growth direction of the layers of the second member and the profiled mating surfaces fit together, the first member comprises a waveguide circuit comprising a waveguide and the second member comprises an optoelectronic device with its own optical output which is connected to the waveguide of the first member, the first and second members also being electrically connected.

7 Claims, 5 Drawing Sheets

(51) Int. Cl.
*H01L 33/06* (2010.01)
*H01L 33/58* (2010.01)

(56) References Cited

U.S. PATENT DOCUMENTS

| | | | | |
|---|---|---|---|---|
| 6,665,476 B2* | 12/2003 | Braun | ............... | G02B 6/12002 385/14 |
| 6,774,389 B2* | 8/2004 | Hanamaki | ............ | B82Y 20/00 257/101 |
| 6,917,056 B2* | 7/2005 | Dautartas | ............ | G02B 6/3636 257/98 |
| 7,906,355 B2* | 3/2011 | Hodono | ............... | G02B 6/4204 257/99 |
| 2002/0051607 A1* | 5/2002 | Ido | ............... | G02B 6/125 385/49 |
| 2008/0008477 A1* | 1/2008 | Ogawa | ............... | G02B 6/43 398/164 |
| 2011/0133063 A1* | 6/2011 | Ji | ............... | G02B 6/122 250/227.24 |
| 2012/0189245 A1* | 7/2012 | Bowen | ............... | G02B 6/4214 385/14 |
| 2012/0326116 A1* | 12/2012 | Ellis | ............... | B82Y 10/00 257/9 |
| 2013/0129277 A1* | 5/2013 | Katsuyama | ............ | G02B 6/125 385/14 |
| 2016/0356708 A1 | 12/2016 | Bennett et al. | | |
| 2018/0108804 A1* | 4/2018 | Ellis | ............... | H01L 33/0012 |

OTHER PUBLICATIONS

Agnihotri et. al., "Silicon Oxynitride Waveguides for Optoelectronic Integrated Circuits", Jpn. J. Appl. Phys. vol. 36 (1997) pp. 6711-6713, Part I, No. 11, Nov. 1997.*
Combined Great Britain Search and Examination Report dated Feb. 28, 2017 in Great Britain Patent Application No. GB1617922.8.

* cited by examiner

OPTOELECTRONIC SYSTEM AND METHOD FOR ITS FABRICATION

FIELD

Embodiments described herein relate generally to the field of optoelectronic systems and methods for their fabrication.

BACKGROUND

In quantum optical devices, there is a need to manipulate weak light pulses through a number of logic components or other optical processing regions. For these devices to become commercially viable there is a need to develop scalable fabrication techniques for such devices.

BRIEF DESCRIPTION OF THE FIGURES

Systems and methods in accordance with non-limiting embodiments will now be described with reference to the accompanying figures in which.

DETAILED DESCRIPTION

Figure 1:
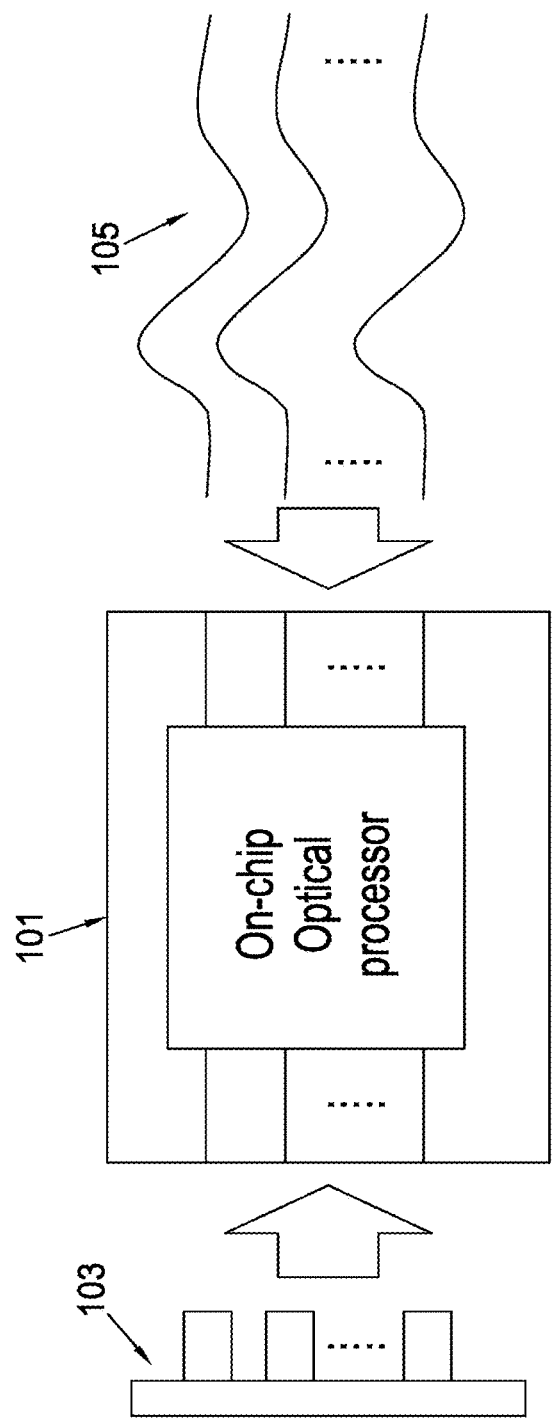
FIG. 1 is a schematic demonstrating the general concept of devices in accordance with embodiments of the invention.

An optoelectronic system comprising a first member and a second member, said first member and said second member comprising a plurality of layers, wherein each member has a profiled mating surface, the first member being connected to the second member such that the growth direction of the layers of the first member are orthogonal to the growth direction of the layers of the second member and the profiled mating surfaces fit together, the first member comprises a waveguide circuit comprising a waveguide and the second member comprises an optoelectronic device with its own optical output which is connected to the waveguide of the first member, the first and second members also being electrically connected.

In the above structure, the second member is turned through 90° and butt coupled to the waveguide circuit.

The two members are brought in to contact, positioned so that the optical paths align and bonded together (using an optically transparent bonding medium) placed between them. The profiling of the mating surfaces prevents this bonding medium from covering and insulating the electrical contacts, thus allowing the subsequent electrical interconnection of the two members.

The term "waveguide circuit" has been used, this can be any optical circuit such as a planar waveguide circuit.

In the above optoelectronic system, the second member may be a semiconductor structure. In a further embodiment, the first member may be a semiconductor structure and in some embodiments, it is an amorphous structure.

The above structure may comprise a single optoelectronic device with a single optical output coupled to a waveguide of the waveguide circuit. In further embodiments, a plurality of optoelectronic devices are provided each having their own optical output. Here, each optical output is coupled to a corresponding waveguide in the first member.

Where there is a single optoelectronic device, the first member may comprise a profiled edge surface having at least one void and located away from the waveguide and said at least one void being filled with a conductive material, said conductive material being connected to a conductive protrusion from said second member that extends into said void.

Where there are a plurality of optoelectronic devices, the first member may comprise a profiled edge surface having a plurality of voids located between said waveguides and said plurality of voids being filled with a conductive material, said conductive material being connected to a conductive protrusion from said second member that extends into at least one void.

In an embodiment, the waveguide circuit of said first member is connected via an optically transparent bonding medium to an optical output of the second member. The waveguide circuit may comprise layers of Silicon Oxynitride of differing refractive index on a silicon substrate. The second member may comprise an array of quantum light sources, each containing a single active semiconductor quantum dot.

In a further embodiment a method of fabricating an optoelectronic system is provided, the method comprising:
providing a first member said first member having a layered structure comprising a waveguide circuit and an optical channel that terminates at an edge of the first member, said first member having a profiled mating surface; and
providing a second member, said second member comprising a layered structure comprising an optoelectronic device with an optical output, said second member having profiled mating surface,
the method further comprising:
connecting the first member and the second member, such that the growth direction of the layers of the first member are orthogonal to the growth direction of the layers of the second member and the profiled mating surfaces fit together, wherein the optical output of the second member is connected to the optical channel of the first member and the first and second members being electrically connected.

As before, the waveguide circuit may comprise a plurality of optical channels and the second member may comprise a plurality of optoelectronic devices each having their own optical output, the method comprising connecting the plurality of optical outputs to the plurality of optical channels.

In a further embodiment, providing said first member comprises:
forming said profiled mating surface at an edge of the first member, the profiled surface being provided with voids in the first member, said voids being separated from the optical channels, and wherein providing said second member comprises forming said profiled mating surface such that electrical contacts protrude from the surface of the second member, and wherein connecting the first member and the second member comprises aligning the first and second members such that the electrical contacts of the second member extend into the voids of the first member and filling the voids with an electrically conductive and flowable material.

A metal layer may be provided to coat the inside of the voids prior to align the first and second members. In an embodiment, the voids are trenches.

The electrical contacts of the second member may comprise a mound of conductive material to allow them to protrude from the surface.

In a further embodiment, forming a profiled surface of the second member comprises etching the surface of the optoelectronic element to form a protruding element and subsequent covering of said protruding element with a metallic film, such that the protruding element can extend into a void on the first member when the first and second members are connected. The electrically conductive and flowable material may be a conductive 2-part epoxy.

In a further embodiment, the method further comprises forming an optically transparent bonding layer on one or both of the mating surfaces of the first and second members and connecting said first and second members using said optically transparent bonding layer. The optically transparent bonding layer may comprise a UV-curable optical adhesive. The method may further comprise curing the optically transparent bonding layer using ultraviolet light.

A continuous layer or adhesive may be provided along the connection between the first and second members.

FIG. 1 is a schematic demonstrating the general concept in accordance with embodiments of the present invention. There is provided a first member 101. The first member 101 is a layered semiconductor structure. In the particular example shown in FIG. 1, an on-chip optical processor is shown. This can be any type of optical processor. Possible examples are a waveguide circuit or network which may be adapted to realise any desired optical processing operation, for example, a C-NOT photonic logic gate; creation and manipulation of NOON state; a Mach-Zehnder interferometer; a Boson Sampling device; or a quantum amplifier.

In the embodiment of FIG. 1, the waveguide circuit is a planar lightwave circuit. It comprises N-channels where N is an integer of at least one. In order to process the light signals, the first member receives N optical inputs, the light signals from these inputs are carried to the lightwave circuit and, manipulated within the lightwave circuit by waveguides. The waveguides (not shown) need to receive the incoming light signals.

The second member 103 supplies the light signals to the first member 101 for processing. The second member 103, may comprise, but is not limited to: an array of optoelectronic devices; an array of single photon sources; an array of entangled photon sources; an array of vertical-emission optoelectronic cavity devices; an array of vertical-emission, cavity enhanced, electrically controlled quantum light sources; an array of surface-emitting laser devices; an array of light modulators; or an array comprising a combination of any/all of the above.

As will be explained in more detail with reference to the later figures, the first member 101 and the second member 103 are brought into contact and positioned so that there optical path between them and the two members are bonded together using an optically transparent bonding medium that is placed between them.

The first and second members are connected at mating surfaces. Both of the mating surfaces are profiled such that the surfaces fit together. The profiling of the mating surfaces prevents the bonding medium from covering and insulating electrical contacts between the members and allows subsequent electrical interconnection between the members.

A third member 105 is also shown in FIG. 1. Here, this may be provided by a number of different components, for example: optical fibres; a pre-assembled array of optical fibres; an array of photon detectors; an array of optoelectronic devices as described for the second member; a waveguide circuit as described for the first member; or a combination of any/all of the above. As the connection between the first member and the third member can be the same as the connection between the first member and the second member or a more standard type of connection, this will not be discussed further.

Figure 2:
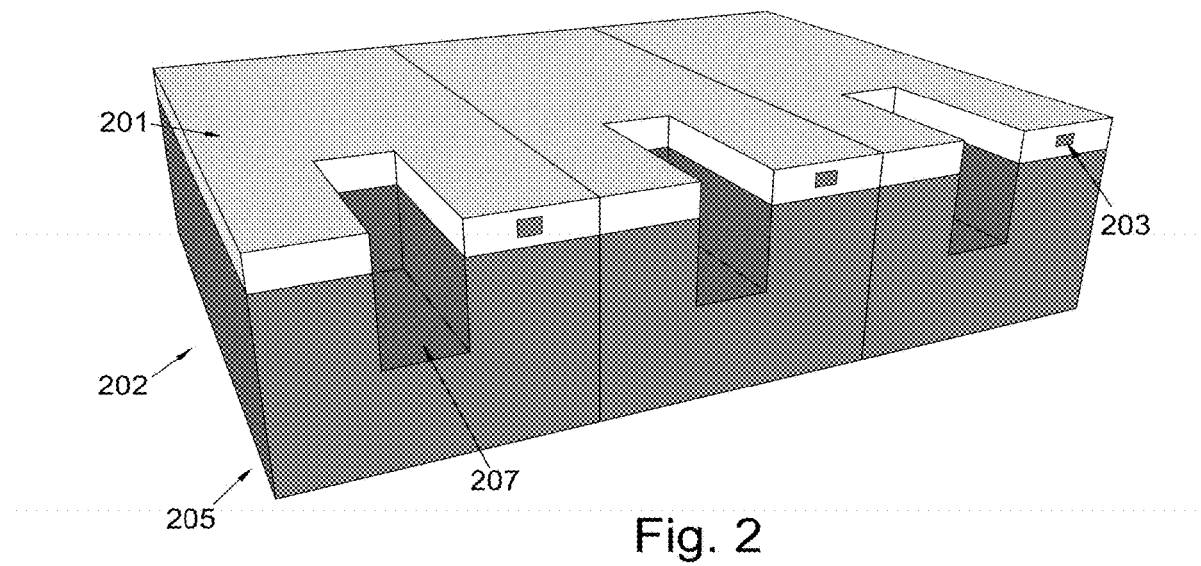
FIG. 2 is a schematic of a first member at an early processing stage for use in a method in accordance with an embodiment of the present invention.

FIG. 2 shows a first member 202 in accordance with an embodiment of the present invention. To keep the figures simple, only the connecting portion of the waveguide circuit located on first member 202 will be shown. However, it will be appreciated these waveguides can then connect to any lightwave circuit not necessarily limited to those specifically mentioned above.

The connecting portion comprises a semiconductor body 205. The semiconductor body 205 may be a single layer or a plurality of layers such as buffer layers, distributed Bragg reflectors etc. The connecting portion carries both optical and electrical signals. The optical signals are transmitted via a waveguide channel 203 which is provided in cladding region 201. The cladding region 201 is provided on top of the body layers 205. The cladding region 201 comprises the waveguide channel 203 which is defined by higher index refractive layers surrounding the channel 203. The cladding region is formed by depositing an undercladding layer and then core layers. Next the core layer or layers are etched to form the waveguide core. Finally, and overcladding layer is provided over the patterned core layer and the undercladding layer. In further embodiments, other methods of fabricating the waveguide may be used, for example the waveguide can be created by locally modifying the refractive index of bulk material, for example by using a focussed UV laser.

To form a profiled mating surface, trenches 207 are provided through the cladding region 201 and the semiconductor body 205 extending through the edge of the first member. It should be noted that the trenches 207 are formed well away from the waveguide channel 203.

In an example, an underclad layer of $SiO_2$ is deposited by PECVD onto a clean Si wafer with a thickness of ~5 μm. It should be noted that the Si wafer will eventually form the semiconductor body 205.

The core of the waveguide channel 203 is then formed. First, a "core" layer of $SiO_xN_y$ is deposited by PECVD on top of the $SiO_2$ undercladding layer. In this example the thickness of the core is 1.6 μm.

The desired waveguide channels 203 are defined lithographically and the pattern transferred into the $SiO_xN_y$ layer by dry etching. After the remaining mask material from the lithographic process and any etch residues have been removed, an overcladding layer of again 5 μm of $SiO_2$ is deposited. This completes the arrangement of the cladding region 201 surrounding the waveguide channels 203.

Any additional features or on-chip components (such as resistive heaters) may be fabricated at this point on the surface of the overcladding SiO$_2$ layer.

To form the trenches 207, a polymer resist is used. First, the Si wafer with cladding region 201 is coated with a thick resist material (not shown). For this example a 35 μm-thick layer of SU-8 is used. This material is patterned to create windows ~100 μm wide where it is desired to form the electrical interconnect regions. Using this single mask layer, the SiO$_2$ cladding and the silicon wafer below are etched to form the trenches 207. The etch typically goes 80-150 μm into the silicon substrate. The remaining SU-8 mask is removed along with any etch residues.

Depending on the wafer used as a substrate for the waveguide devices, a thin (~100 nm) layer of PECVD SiO2 may be deposited over the whole sample.

Figure 3:
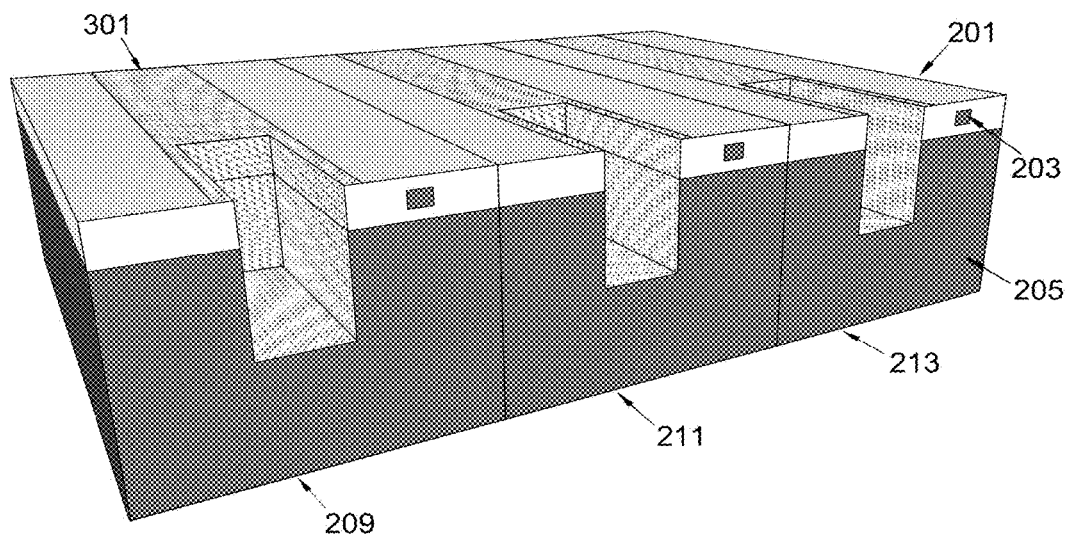
FIG. 3 is a schematic of the first member shown in FIG. 2 at a later processing stage.

FIG. 3 shows the next fabrication step. Here, metal tracks 301 are deposited onto the surface of the first member 101. The tracks 301 extend into the trenches 207. In the particular embodiment demonstrated in FIG. 3, it can be seen that the metal tracks 301 alternate with the waveguide channels 203. Also, it can be seen that there are 3 units 209, 211 and 213 formed in the first member 103. In this example, each unit provides the electrical and optical connection for each channel. However, different numbers of units could be envisaged, different types of configurations etc. There is no need for each unit to be identical. For example, there may be different spacings between the waveguide channel 203 and the electrical tracks 301, there may be multiple electrical tracks or multiple waveguide channels in different units.

It should be noted that the trenches 207 are coated with metal on each side and their base.

The metal contact tracks 301 are defined lithographically and produced from 20/100 nm layer of typically TiAu, patterned by lift-off. The individual die are then separated using a wafer saw.

Figure 4:
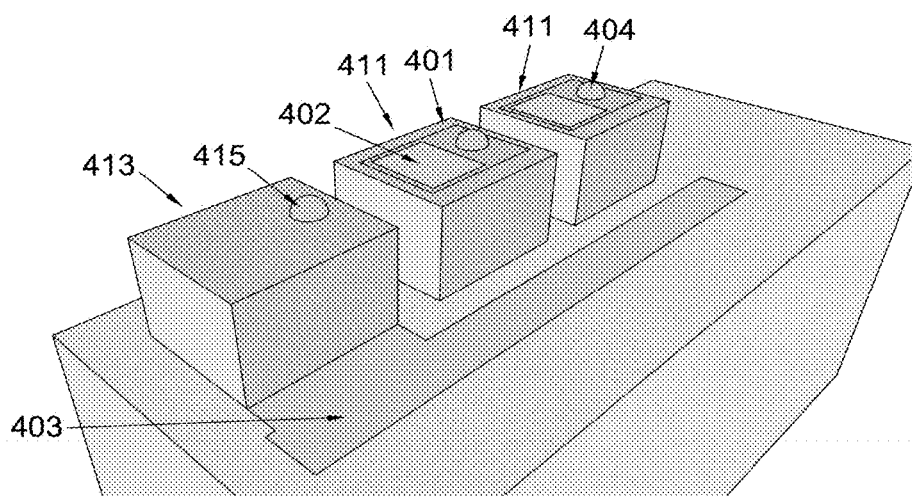
FIG. 4 is a schematic of a second member for use in a method in accordance with an embodiment of the present invention.

FIG. 4 shows a schematic of the second member 103 which comprises an array of optoelectronic devices. The optoelectronic devices 411 are formed by depositing a layer structure. For example, if the optoelectronic device is a single photon emitter, a quantum dot layer may be provided within the optoelectronic device which, for example, can be electrically activated. Other types of optoelectronic devices can be envisaged. The optoelectronic device 411 used here is the type of device that will emit radiation out of the plane of the layers.

As an example, the optoelectronic device 411 will be taken to be a quantum dot LED structure. The deposited layer structure will comprise an upper mirror comprising a GaAs/AlGaAs distributed Bragg mirror (DBR) of alternating layers of 66.0 nm GaAs and 77.3 nm AlAs having 4 repeats. The layers are p-doped. All the layers λ/4n thick where n is the refractive index and λ the wavelength. The upper mirror is provided over an intrinsic GaAs region. The intrinsic GaAs region comprises 1λ/n=263.9 nm thick containing embedded quantum dot at the centre of the optical cavity. The intrinsic cavity overlies a lower mirror comprising an GaAs/AlGaAs Bragg mirror having 10 repeats where the first few repeats are n-doped. All layers are λ/4n thick. The lower layer is formed on a GaAs substrate.

Mesas are defined lithographically to isolate devices 411 from each other. The mesas are formed by etching entirely through the upper DBR and GaAs cavity region, stopping in the n-doped portion of the lower mirror.

There is an optically transparent window 402 which allows the light emitted from the device 411 to be output. The devices 411 are then etched to be separated into individual optoelectronic devices. A top electrical contact 401 is provided on the surface of each device 411. The top electrical contact 401 is configured such that it has a part that protrudes above the top surface of the mesa that defines optoelectronic device 411. More specifically, the protrusion extends further from the surface of the device 411 than the window 402.

The optically transparent window 402 can be fabricated by a number of different methods, for example, in one embodiment, the top contact is patterned during formation by lithography to have an aperture within said contact. In a further embodiment, carefully calibrated dielectric layers may be provided over this aperture to form, for example, an anti-reflective coating to improve optical coupling between the two members.

The contact 401 in this particular example is shown with a gold bump 404 formed on the surface of the contact that extends the contact above the surface. However, other options are possible, for example, the surface could be patterned and etched so that the top contact or a part of the top contact protrudes from the surface. In an example, ohmic contact is made to the n-doped region using AuGeNi in this case, patterned by lift-off. Bond pads are formed on top of the mesa using an evaporated layer of TiAu(CrAu), patterned by lift-off. Gold bumps are placed centrally on each bond pad using a ball-bonder in bumping mode whereby the ball bonder only makes a first bond (ball bond) and then removes detaches the ball from the rest of the wire to leave a "bump".

As noted above, in FIG. 4, a gold bump 404 is shown. However, this could also be any type of conductive material that increases the height of the contact 404 above the surface.

In FIG. 4, in addition to the optoelectronic devices 411, there is a bottom contact 403. Bottom contact 403 is connected to contact region 413 which, in this example is defined by a mesa to be of a similar size to the optical devices 411. The contact region 413 comprises a contact 415 which extends beyond the surface of the mesa in the same way as contacts 404 in relation to the optoelectronic devices 411. Contact 415 can be fabricated in the same manner as contacts 401 and 404, for example it may comprise excess material or part of the contact region 413 may be etched to allow part of the contact to protrude.

The contact region 413 provides electrical contact between contact 415 and the bottom contact 403 which, may for example be back gate contact or a buried contact. The details of optoelectronic device chip are not shown. However, it will be appreciated by those skilled in the art that the back contact 403 would be connected to a lower layer in the structure.

Figure 5:
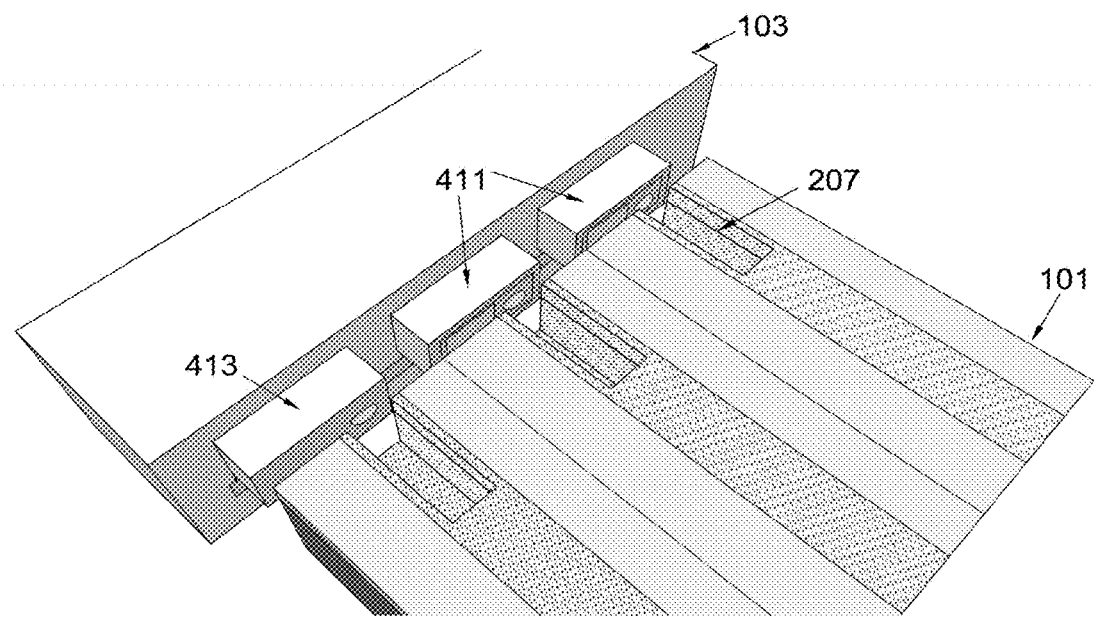
FIG. 5 is a schematic showing the arrangement of the first member and the second member during connection of the 2 members.

FIG. 5 shows how the first member 101 may be connected to the second member 103. The second member 103 has been described with reference to FIG. 4. To avoid any unnecessary repetition, like reference numerals will be used to denote like features. The second member 103 is turned on its side so that optical devices 411 and contact region 413 are provided on the side of the device. The second member 101 is provided in its planar configuration with the alternating electrical tracks and optical channels. The size of the optical devices 411 and the trenches 207 and optical channels have been designed so that the optical channels (203 from FIG. 3) positioned adjacent the optical windows 402 of the first member. The trenches 207 are provided such that the protruding part of contact 404 extends into the trench. The protrusion is also sized so that laterally it fits within the trench.

If desired, a pre-assembled array of optical fibres may be bonded onto the unpatterned facet of the first member 101 using careful alignment and UV-curable optical adhesive. The two components, i.e. the first member 101 and the second member 103 are then mounted onto an assembly rig. The second member 103 is held with the substrate vertically so that the top of the mesas face towards the patterned end-facet of the first member.

The first and second members are carefully aligned to ensure the gold bumps locate in each "slot", the waveguides simultaneously align with the windows 402 in the contact pad on each mesa, and that the first and second members are square and parallel.

Figure 6:
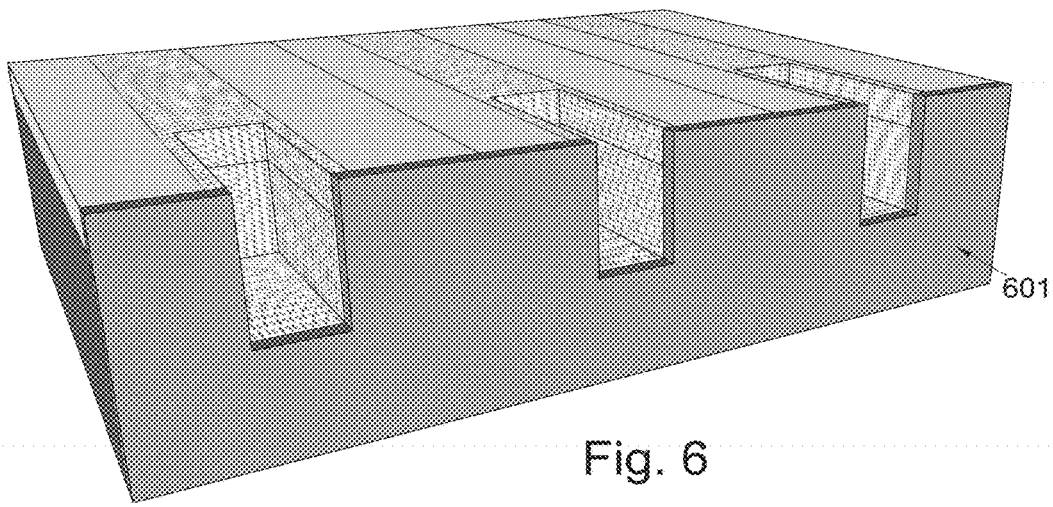
FIG. 6 is a schematic of the first member showing the position of the bonding medium.

As shown in FIG. 6, prior to assembling the device, an optically transparent bonding material 601 is provided on the mating surface of the first member 101. However, in further embodiments, the transparent bonding material is provided on both mating surfaces. In an example, this is a thin film of UV-cure adhesive is applied to the end of the first member, for example Dymax OP4-20632 or Kloe K-PUM-01 may be used as an adhesive. The first and second members are brought into firm contact to ensure a good final bond is achieved. The adhesive is then cured by exposure to blue/UV light and subsequently oven baked to accelerate the natural cure rate of the exposed adhesive.

Figure 7:
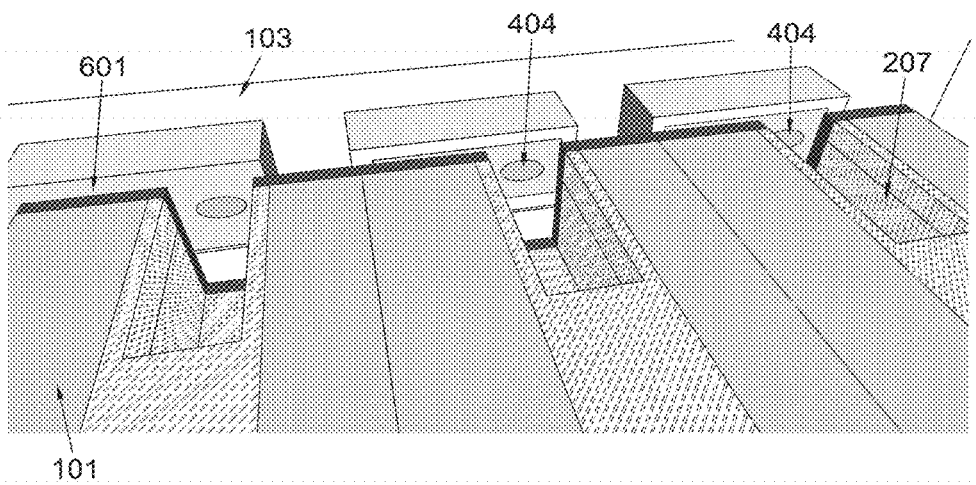
FIG. 7 is a schematic showing the connection of the first member and the second member using the bonding medium.

Next, as shown in FIG. 7, the first member 101 with the optical bonding medium 601 on its mating surface is pushed against the second member 103. As explained above, the first member 101 is positioned such that the contoured contacts 404 of the second member are located within the trenches 207 and the waveguide channels 203 are aligned against the optical windows (not shown). The optically transparent bonding medium allows the transfer of light from the optical window 402 of the second member 103 through to the waveguide channel 203 of the first member. The contoured contact 404 extends far enough away from the surface of the optoelectronic devices 411 so that it extends into the trench even when the bonding material is present. The bonding medium is allowed to cure. Profiling the two surfaces allows a strong bond to be formed and the optical window aligned with the end of the waveguide, whilst preventing the bonding medium from covering and insulating any of the electrical contacts.

Figure 8:
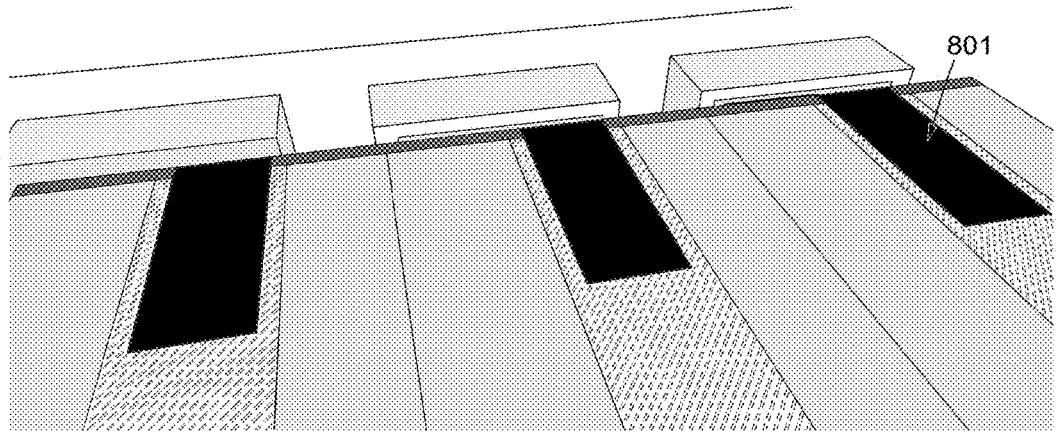
FIG. 8 is a schematic showing the connection between the first member and the second member with electrical connection.

Next, as shown in FIG. 8, the void between the optoelectronic devices contact in the metal track on the first member 101 is infilled with a flowable conductive medium to complete the electrical link for each track 301.

In an example, the flowable conductive medium is silver epoxy. The trenches are infilled by the precision application of this silver epoxy, such that a robust electrical link between each gold bump and the TiAu track within the mating channel is achieved. In an example Polytec EC-235 silver epoxy is used.

Therefore, a device has been produced where there is a strong optical connection via the optically transparent bonding medium which connects the optical window 402 in the waveguide channel 203 and there is a strong electrical contact between profile contact 404 and electrical track 301 via the infilled conductive material 801.

Figure 9:
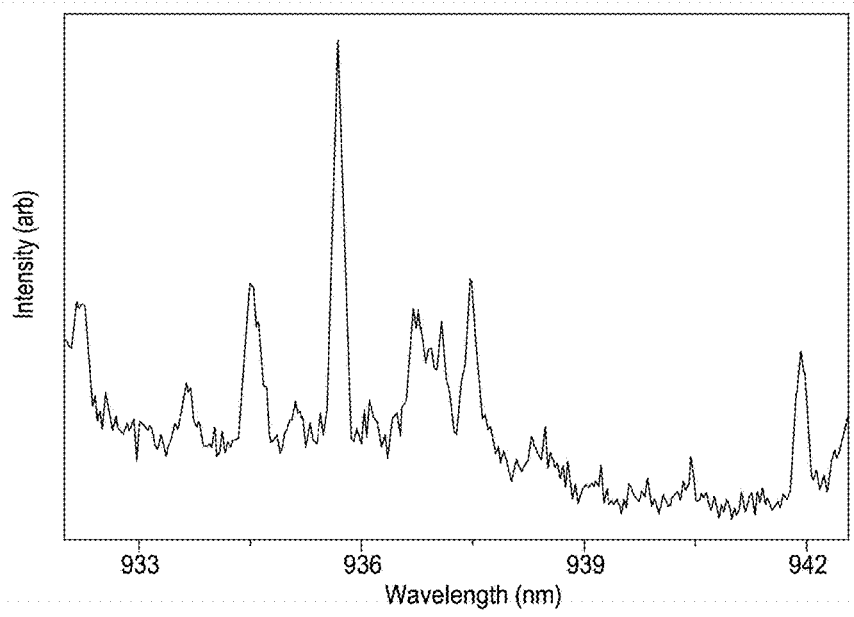
FIG. 9 is a plot of the intensity against wavelength for an optical device fabricated as described with reference to the earlier figures.

FIG. 9 shows a plot of the intensity of radiation against wavelength for a quantum dot LED waveguide structure. Here, the spectrum is collected from the end of the waveguide.

Methods in accordance with the above embodiments can allow the fabrication of self-contained, chip-based integrated devices combining multiple end-coupled discrete optoelectronic components with optical processors, for example, quantum optical processors with multiple, independent LED-single photon sources integrated with a waveguide circuit, quantum sensors with integrated, multiple on-chip sources and detectors, quantum networking devices and quantum metrology devices.

While certain embodiments have been described, these embodiments have been presented by way of example only, and are not intended to limit the scope of the inventions. Indeed the novel methods and systems described herein may be embodied in a variety of other forms; furthermore, various omissions, substitutions and changes in the form of methods and systems described herein may be made without departing from the spirit of the inventions. The accompanying claims and their equivalents are intended to cover such forms of modifications as would fall within the scope and spirit of the inventions.

The invention claimed is:

1. An optoelectronic system comprising a first member and a second member, said first member and said second member comprising a plurality of layers, wherein each member has a profiled mating surface, the first member being connected to the second member such that the growth direction of the layers of the first member are orthogonal to the growth direction of the layers of the second member and the profiled mating surfaces fit together, the first member comprising a semiconductor body and a cladding layer provided on said semiconductor body, a waveguide channel provided through said cladding layer, and the second member comprising an optoelectronic device with its own optical output which is connected to the waveguide channel of the first member, wherein the first member comprises a profiled edge surface having at least one void and located away from the waveguide channel and said at least one void being filled with a conductive material, said conductive material being connected to a conductive protrusion from said second member that extends into said void to allow the first and second members to be electrically connected.

2. An optoelectronic system according to claim 1, wherein the second member is a semiconductor structure.

3. An optoelectronic system according to claim 1, wherein the second member comprises a plurality of optoelectronic devices and the first member comprises a plurality of corresponding waveguide channels, wherein the optical output of each of the optoelectronic devices is connected to a waveguide channel.

4. An optoelectronic system according to claim 3 wherein the first member comprises a profiled edge surface having a plurality of voids located between said waveguide channels and said plurality of voids being filled with a conductive material, said conductive material being connected to a conductive protrusion from said second member that extends into at least one void.

5. An optoelectronic system according to claim 1, wherein the waveguide channel of said first member is connected via an optically transparent bonding medium to an optical output of the second member.

6. An optoelectronic system to claim 1, wherein the first member comprises layers of Silicon Oxynitride on a silicon substrate to form said cladding layer.

7. An optoelectronic system according to claim 1, wherein the second member comprises an array of quantum light sources, each containing a single active semiconductor quantum dot.

* * * * *